US011309038B2

(12) United States Patent
Cho

(10) Patent No.: US 11,309,038 B2
(45) Date of Patent: Apr. 19, 2022

(54) MEMORY DEVICE AND METHOD OF OPERATING THE MEMORY DEVICE

(71) Applicant: SK hynix Inc., Icheon-si Gyeonggi-do (KR)

(72) Inventor: Hyun Chul Cho, Icheon-si Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/996,213

(22) Filed: Aug. 18, 2020

(65) Prior Publication Data

US 2021/0280259 A1 Sep. 9, 2021

(30) Foreign Application Priority Data

Mar. 3, 2020 (KR) .................. 10-2020-0026657

(51) Int. Cl.
*G11C 16/30* (2006.01)
*G11C 16/08* (2006.01)
*G11C 16/32* (2006.01)

(52) U.S. Cl.
CPC .............. *G11C 16/30* (2013.01); *G11C 16/08* (2013.01); *G11C 16/32* (2013.01)

(58) Field of Classification Search
CPC ......... G11C 16/30; G11C 16/08; G11C 16/32; G11C 5/025; G11C 5/145; G11C 7/1042; G11C 7/1045; G11C 16/0483; G11C 16/24
See application file for complete search history.

(56) References Cited

U.S. PATENT DOCUMENTS

| 6,038,178 A | 3/2000 | Oh |
| 6,079,023 A | 6/2000 | Yoon et al. |
| 6,724,242 B2 | 4/2004 | Kim et al. |
| 10,014,768 B2 | 7/2018 | Zhou et al. |
| 2012/0020161 A1* | 1/2012 | Haukness ............... G11C 16/10 365/185.17 |
| 2016/0048343 A1* | 2/2016 | Pekny .................... G11C 16/26 711/103 |
| 2017/0131904 A1* | 5/2017 | Rajwade .................. G11C 8/12 |
| 2021/0202014 A1* | 7/2021 | Chae ...................... G11C 16/30 |

FOREIGN PATENT DOCUMENTS

| KR | 1020140078609 A | 6/2014 |
| KR | 101949550 B1 | 2/2019 |

* cited by examiner

*Primary Examiner* — Jay W. Radke
(74) *Attorney, Agent, or Firm* — William Park & Associates Ltd.

(57) ABSTRACT

A memory device may include: a memory cell array including a plurality of planes; and a voltage generation circuit including a master pump component and at least one or more sub-pump components that respectively correspond to the planes. During an interleaved operation, the master pump component may generate a first output voltage in response to a first pump clock, and the sub-pump components may generate second output voltages in response to second pump clocks. The master pump component and the sub-pump components may respectively provide the first output voltage and the second output voltages to the corresponding planes. During a non-interleaved operation, the master pump component and the sub-pump components may generate the first output voltage in response to the first pump clock and provide the first output voltage to a selected plane of the plurality of planes.

26 Claims, 10 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119 (a) to Korean patent application number 10-2020-0026657, filed on Mar. 3, 2020, in the Korean Intellectual Property Office, the entire disclosure of which is incorporated herein by reference.

BACKGROUND

1. Technical Field

Various embodiments of the present disclosure relate to an electronic device, and more particularly, to a memory device and a method of operating the memory device.

2. Related Art

Recently, the paradigm for the computer environment has been converted into ubiquitous computing so that computer systems can be used anytime and anywhere. Thereby, the use of portable electronic devices such as mobile phones, digital cameras, and notebook computers has rapidly increased. In general, such portable electronic devices use a memory system which employs a memory device, in other words, use a data storage device. The data storage device is used as a main memory device or an auxiliary memory device of the portable electronic devices.

A data storage device using a memory device provides advantages in that, since there is no mechanical driving part, stability and durability are excellent, an information access speed is increased, and power consumption is reduced. Examples of a data storage device proposed as the memory system having such advantages may include a universal serial bus (USB) memory device, a memory card having various interfaces, and a solid state drive (SSD).

The memory devices are classified into volatile memory devices and nonvolatile memory devices.

Although read and write speeds are comparatively low, the nonvolatile memory device can retain data stored therein even when power supply is interrupted. Therefore, the nonvolatile memory device is used when there is the need for storing data which must be maintained regardless of supply of power. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type and a NAND type.

SUMMARY

An embodiment of the present disclosure may provide for a memory device of which may include: a memory cell array comprising a plurality of planes; and a voltage generation circuit comprising a master pump component and at least one or more sub-pump components that respectively correspond to the plurality of planes. During an interleaved operation, the master pump component may generate a first output voltage in response to a first pump clock, and the at least one or more sub-pump components may generate second output voltages in response to second pump clocks. The master pump component and the at least one or more sub-pump components may respectively provide the first output voltage and the second output voltages to the corresponding planes. During a non-interleaved operation, the master pump component and the at least one or more sub-pump components may generate the first output voltage in response to the first pump clock and provide the first output voltage to a selected plane of the plurality of planes.

An embodiment of the present disclosure may provide for a memory device of which may include: a memory cell array comprising a plurality of planes; and a voltage generation circuit comprising a master pump component and at least one or more sub-pump components that respectively correspond to the plurality of planes. The voltage generation circuit may provide, during an interleaved operation, a plurality of output voltages that are respectively generated from the master pump component and the at least one or more sub-pump components respectively to the plurality of planes, and provide, during a non-interleaved operation, an output voltage generated from the master pump component to a selected plane of the plurality of planes.

An embodiment of the present disclosure may provide for a memory device of which may include: a memory cell array comprising a first plane and a second plane; and a voltage generation circuit comprising a master pump component corresponding to the first plane and a sub-pump component corresponding to the second plane, and configured to provide, during an interleaved operation, a first output voltage generated from the master pump component to the first plane and provide a second output voltage generated from the sub-pump component to the second plane, and selectively provide, during a non-interleaved operation, the first output voltage generated from the master pump circuit to the first plane or the second plane.

An embodiment of the present disclosure may provide for a method of operating a memory device such that the device performs an interleaved operation and a non-interleaved operation, each in response to a respective command, wherein the interleaved operation comprises: generating, a first output voltage and a second output voltage by activating a master pump component and a sub-pump component that respectively correspond to a first plane and a second plane; and performing overall operations of the first plane and the second plane in an interleaved manner by providing the first output voltage to the first plane and providing the second output voltage to the second plane; wherein the non-interleaved operation comprises: generating, the first output voltage by activating the master pump component; and performing an overall operation of a selected plane of the first plane and the second plane in a non-interleaved manner by providing the first output voltage to the selected plane.

An embodiment of the present disclosure may provide for a memory device of which may include: a memory cell array comprising a plurality of planes; and a voltage generation circuit comprising a master pump component including a first amplifier and at least one or more sub-pump components each including second amplifiers, the master pump component and the at least one or more sub-pump components respectively corresponding to the plurality of planes. During a non-interleaved operation, the second amplifiers may be disabled so that the master pump component and the at least one or more sub-pump components generate the first output voltage in response to a first pump clock generated by the first amplifier to provide the first output voltage to a selected plane of the plurality of planes.

An embodiment of the present disclosure may provide for a method of operating a memory device, the method may include: activating, during a non-interleaved operation, an amplifier of a master pump component to generate a first output voltage, disabling, during the non-interleaved operation, an amplifier of a sub-pump component to generate a second output voltage having a level substantially equal to a level of the first output voltage; and performing an overall operation of a selected plane of a first plane and a second plane in a non-interleaved manner by providing the first output voltage to the selected plane.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

Various embodiments of the present disclosure will now be described hereinafter with reference to the accompanying drawings, in which preferred embodiments of the present disclosure are shown, so that those of ordinary skill in the art can carry out the technical idea of the present disclosure.

Various embodiments of the present disclosure are directed to a memory device and a method of operating the memory device, in which a plurality of planes may be operated in an interleaved manner and a non-interleaved manner and, when the plurality of planes are operated in the non-interleaved manner, current consumption may be reduced.

Figure 1:
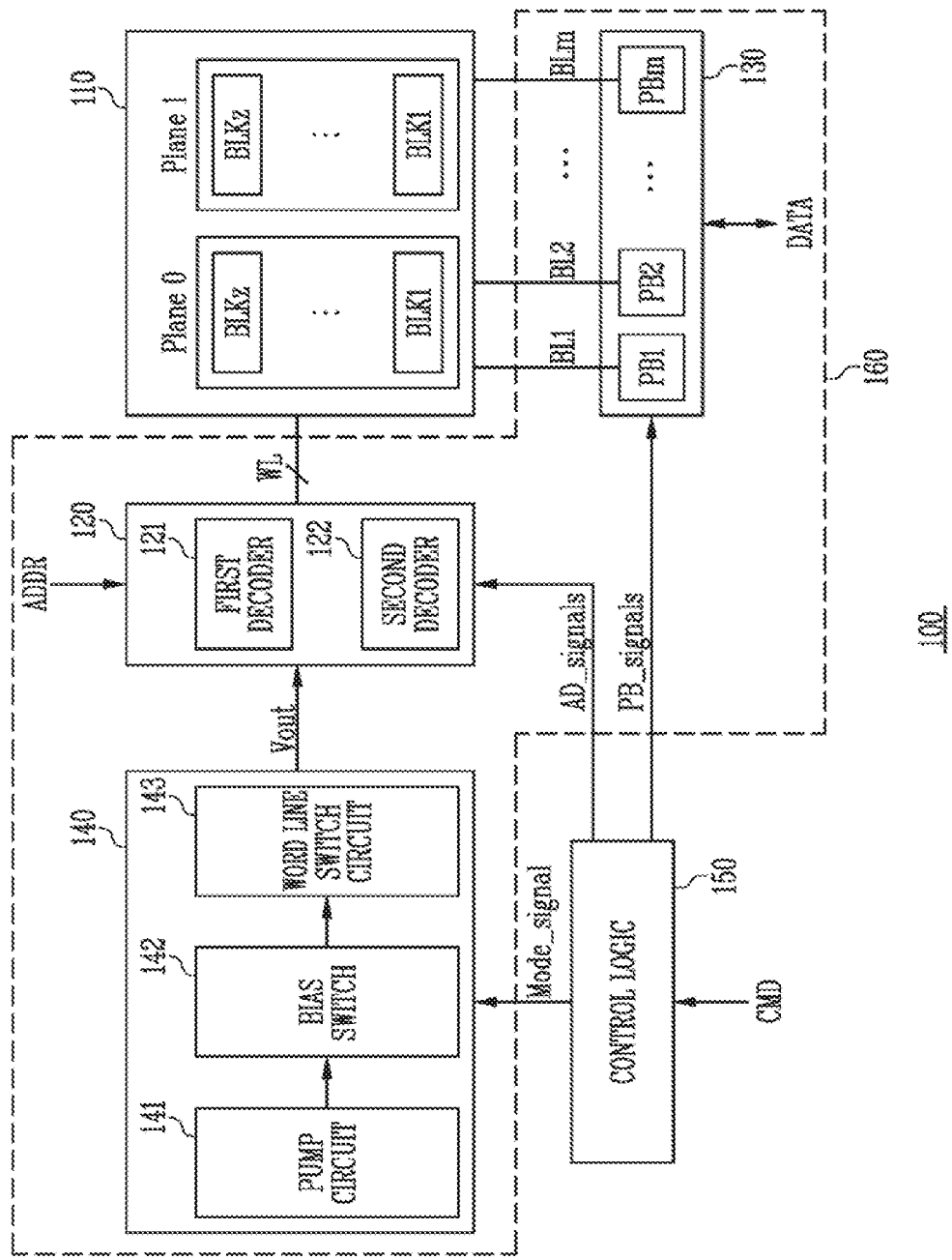
FIG. 1 is a block diagram illustrating a memory device in accordance with an embodiment of the present disclosure.

FIG. 1 is a block diagram illustrating a memory device 100 in accordance with an embodiment of the present disclosure.

Referring to FIG. 1, the memory device 100 includes a memory cell array 110, a word line decoder circuit 120, a read/write circuit 130, a voltage generation circuit 140, and control logic 150. The word line decoder circuit 120, the read/write circuit 130, and the voltage generation circuit 140 may be defined as a peripheral circuit 160 configured to perform a program operation, a read operation, or an erase operation on the memory cell array 110. The control logic 150 may be implemented as hardware, software, or a combination of hardware and software. For example, the control logic 150 may be a control logic circuit operating in accordance with an algorithm and/or a processor executing control logic code.

The memory cell array 110 may include at least two planes. Each plane may include a plurality of memory blocks BLK1 to BLKz. In an embodiment of the present disclosure, for the sake of explanation, the memory cell array 110 will be described as including two planes Plane0 and Plane1 by way of example. In the case where the memory device 100 is operated in an interleaved manner, the planes Plane0 and Plane1 may be simultaneously accessed to perform overall operations. The words "simultaneous" and "simultaneously" as used herein with respect to access occurrences means that the occurrences take place on overlapping intervals of time. For example, if a first occurrence takes place over a first interval of time and a second occurrence takes place simultaneously over a second interval of times, then the first and second intervals at least partially overlaps each other such that there exist a time at which the first and second occurrences are both taking place. In the case where the memory device 100 is operated in a non-interleaved manner, one selected from the planes Plane0 and Plane1 may be accessed to perform overall operations. In the non-interleaved manner, the selected plane accessed only performs the overall operations and the other planes do not perform overall operations while the selected plane is performing the overall operations. The plurality of memory blocks BLK1 to BLKz included in each of the planes Plane0 and Plane1 may be coupled to the word line decoder circuit 120 through word lines WL. The memory blocks BLK1 to BLKz may be coupled to the read/write circuit 130 through bit lines BL1 to BLm. Each of the memory blocks BLK1 to BLKz may include a plurality of memory cells. In an embodiment, the plurality of memory cells may be nonvolatile memory cells. Memory cells coupled to one word line among the plurality of memory cells may be defined as one page. The memory cell array 110 may be configured with a plurality of pages.

Each of the memory blocks BLK1 to BLKz includes a plurality of memory cell strings. Each of the strings may include a drain select transistor, a plurality of memory cells, and a source select transistor which are coupled in series between a bit line and a source line. Furthermore, each of the plurality of strings may include pass transistors respectively provided between the source select transistor and the memory cells and between the drain select transistor and the memory cells, and may further include a pipe gate transistor between the memory cells. The memory cell array 110 will be described later herein.

The word line decoder circuit 120 may include a plurality of decoders 121 and 122. The plurality of decoders 121 and 122 may respectively correspond to the plurality of planes Plane0 and Plane1 included in the memory cell array 110. For example, the first decoder 121 may correspond to the plane Plane0, and the second decoder 122 may correspond to the plane Plane1. The word line decoder circuit 120 may be operated in response to decoder control signals AD_signals generated from the control logic 150. The word line decoder circuit 120 may receive addresses ADDR through an input/output buffer (not shown) provided in the memory device 100.

In the case where the memory device 100 is operated in the interleaved manner, the word line decoder circuit 120 may provide an output voltage Vout generated from the voltage generation circuit 140 to the plurality of planes Plane0 and Plane1 in response to the decoder control signals AD_signals and the addresses ADDR. For instance, the first decoder 121 may perform an overall operation such as a program operation or a read operation by applying an output voltage Vout generated from the voltage generation circuit 140 to word lines WLs of any one selected memory block of the plurality of memory blocks BLK1 to BLKz included in the plane Plane0. The second decoder 122 may perform an overall operation by applying an output voltage Vout generated from the voltage generation circuit 140 to word lines WLs of any one selected memory block of the plurality of memory blocks BLK1 to BLKz included in the plane Plane1. Here, overall operation periods of the plurality of planes Plane0 and Plane1 may overlap with each other.

In the case where the memory device 100 is operated in the non-interleaved manner, the word line decoder circuit 120 may provide an output voltage Vout generated from the voltage generation circuit 140 to a selected plane of the plurality of planes Plane0 and Plane1 in response to the decoder control signals AD_signals and the addresses ADDR. For instance, in the case where the plurality of planes Plane0 and Plane1 are sequentially selected and operated in the non-interleaved manner, the first decoder 121 may perform an overall operation such as a program operation or a read operation by applying an output voltage Vout generated from the voltage generation circuit 140 to word lines WLs of any one selected memory block of the plurality of memory blocks included in the plane Plane0. After the overall operation on the plane Plane0 has been completed, the second decoder 122 may apply an output voltage Vout generated from the voltage generation circuit 140 to word lines WLs of any one selected memory block of the plurality of memory blocks included in the plane Plane1. Here, overall operation periods of the plurality of planes Plane0 and Plane1 might not overlap with each other.

The read/write circuit 130 may include a plurality of page buffers PB1 to PBm. The plurality of page buffers PB1 to PBm may be coupled to the memory cell array 110 through the bit lines BL1 to BLm. Each of the page buffers PB1 to PBm may temporarily store data DATA input from an external device during the program operation and adjust a potential level of a corresponding one of the bit lines BL1 to BLm based on the temporarily stored data DATA. Here, during a read operation, each of the page buffers PB1 to PBm may sense a potential level or current of a corresponding one of the bit lines BL1 to BLm and perform the read operation.

The read/write circuit 130 may operate in response to page buffer control signals PB_signals output from the control logic 140.

In an embodiment, the read/write circuit 130 may include page buffers (or page registers), a column select circuit, etc.

In an embodiment of the present disclosure, only one read/write circuit 130 is illustrated. However, one read/write circuit 130 may be disposed for each of the plurality of planes Plane0 and Plane1. For example, read/write circuits may be respectively disposed for the planes Plane0 and Plane1. Therefore, program operations or read operations of the respective planes may be simultaneously performed in the interleaved manner.

The voltage generation circuit 140 may generate a plurality of operating voltages to be used to perform an overall operation of the memory device 100. For example, the voltage generation circuit 140 may generate a program voltage and a pass voltage during a program operation of the memory device 100, and generate a read voltage and a pass voltage during a read operation.

The voltage generation circuit 140 may perform an operation of generating an output voltage Vout in the interleaved manner or the non-interleaved manner in response to a mode signal Mode_signal output from the control logic 150.

The voltage generation circuit 140 may include a pump circuit 141, a bias switch 142, and a word line switch circuit 143.

In the case where the memory device 100 is operated in the interleaved manner, the pump circuit 141 may simultaneously generate output voltages respectively corresponding to the plurality of planes Plane0 and Plane1. In the case where the memory device 100 is operated in the non-interleaved manner, the pump circuit 141 may generate an output voltage corresponding to a selected plane of the plurality of planes Plane0 and Plane1.

In the case where the memory device 100 is operated in the interleaved manner, the bias switch 142 may transmit, to the switch circuit 143, output voltages that are simultaneously generated from the pump circuit 141 and respectively correspond to the planes Plane0 and Plane1. In the case where the memory device 100 is operated in the non-interleaved manner; the bias switch 142 may transmit, to the switch circuit 143, an output voltage that is generated from the pump circuit 141 and corresponds to a selected plane.

In the case where the memory device 100 is operated in the interleaved manner, the word line switch circuit 143 may receive the output voltages that are simultaneously generated from the pump circuit 141 and respectively correspond to the planes Plane0 and Plane1, and transmit the respective output voltages to the plurality of decoders 121 and 122 of the word line decoder circuit 120.

In the case where the memory device 100 is operated in the non-interleaved manner, the word line switch circuit 143 may receive the output voltage that is generated from the pump circuit 141 and corresponds to the selected plane, and transmit the received output voltage to either the decoder 121 or 122 corresponding to the selected plane.

The control logic 150 may be coupled to the word line decoder circuit 120, the read/write circuit 130, and the voltage generation circuit 150. The control logic 150 may receive a command CMD through an input/output buffer (not shown) of the memory device 100. The command CMD may be a command signal for controlling the memory device 100 to perform an overall operation such as a program operation, a read operation, or an erase operation, and may be a command signal for controlling the plurality of planes Plane0 and Plane1 included in the memory device 100 such that the planes Plane0 and Plane1 are operated in the interleaved manner or the non-interleaved manner. The control logic 140 may control an overall operation of the memory device 100 in response to the command CMD, and more particularly, control the peripheral circuit 160 to perform the overall operation of the memory device 100 in the interleaved manner or the non-interleaved manner in response to the command CMD. For example, the control logic 140 may receive a command CMD corresponding to a read operation or a program operation, and then generate and output, in response to the received command CMD, decoder control signals AD_signals for controlling the word line decoder circuit 120, page buffer control signals PB_signals for controlling the read/write circuit 130, and a mode signal Mode_signal for controlling the voltage generation circuit 140.

Figure 2:
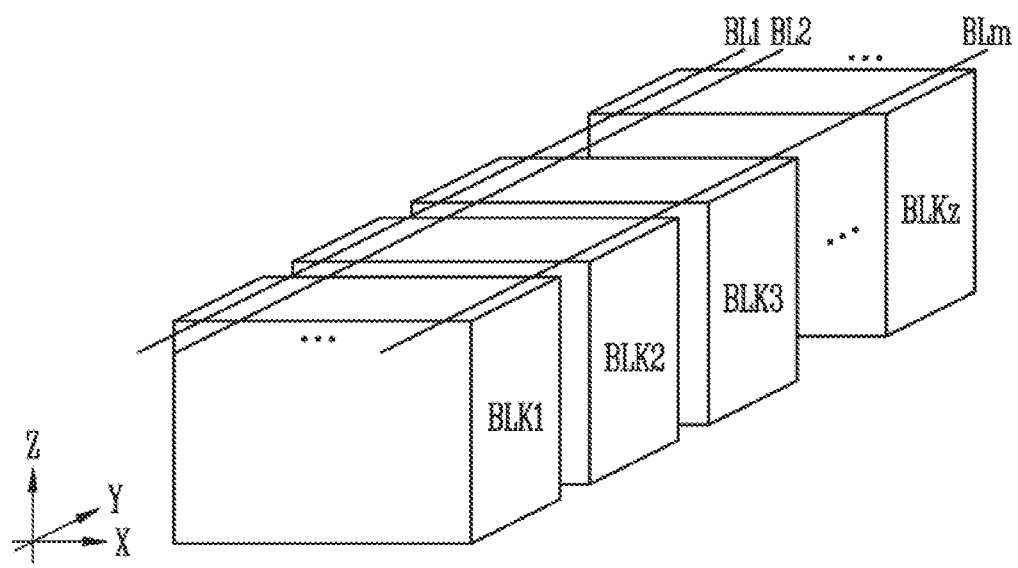
FIG. 2 is a diagram illustrating memory blocks included in one plane.

FIG. 2 is a diagram illustrating memory blocks included in one plane.

Referring to FIG. 2, the plurality of memory blocks BLK1 to BLKz included in the plane Plane0 may be arranged at positions spaced apart from each other in a direction Y in which the bit lines BL1 to BLm extend. For example, the first to z-th memory blocks BLK1 to BLKz may be arranged at positions spaced apart from each other in a second direction Y, and each may include a plurality of memory cells stacked in a third direction Z. Hereinbelow, the configuration of any one memory block of the first to z-th memory blocks BLK1 to BLKz will be described with reference to FIGS. 3 and 4.

Figure 3:
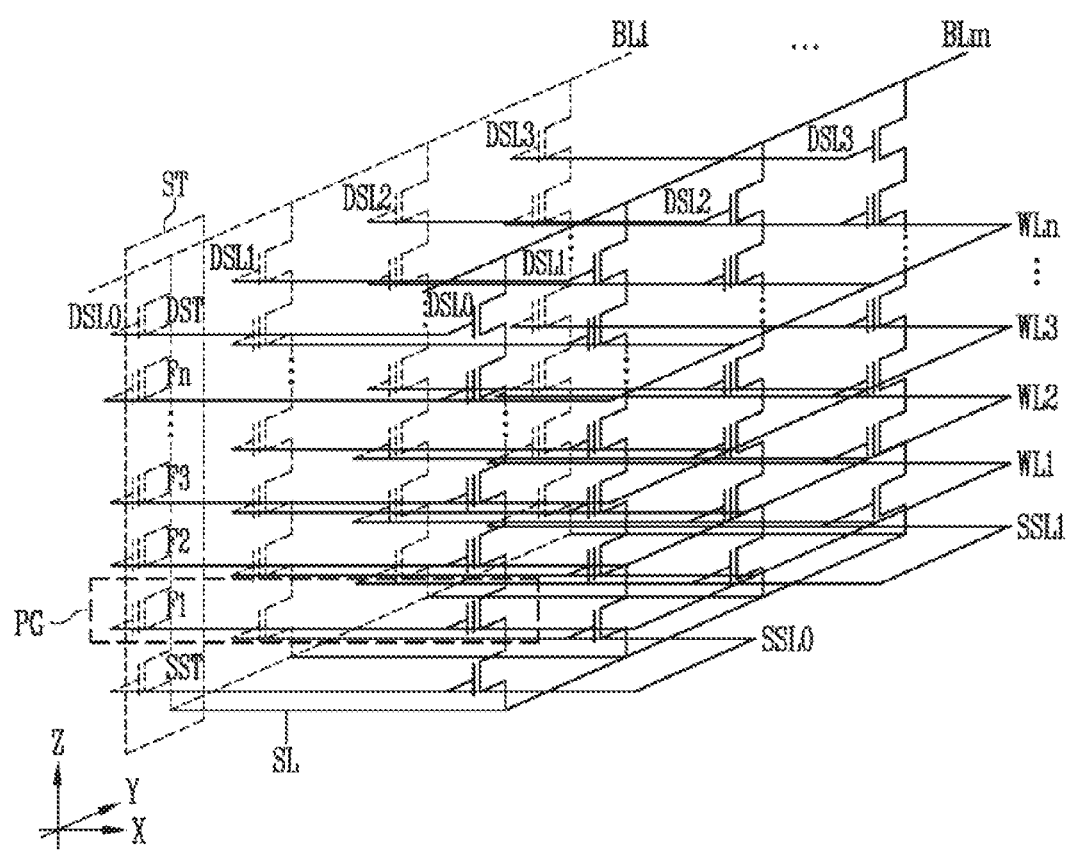
FIG. 3 is a circuit diagram for describing any one of the memory blocks illustrated in FIG. 2.

FIG. 3 is a circuit diagram for describing any one of the memory blocks illustrated in FIG. 2.

Figure 4:
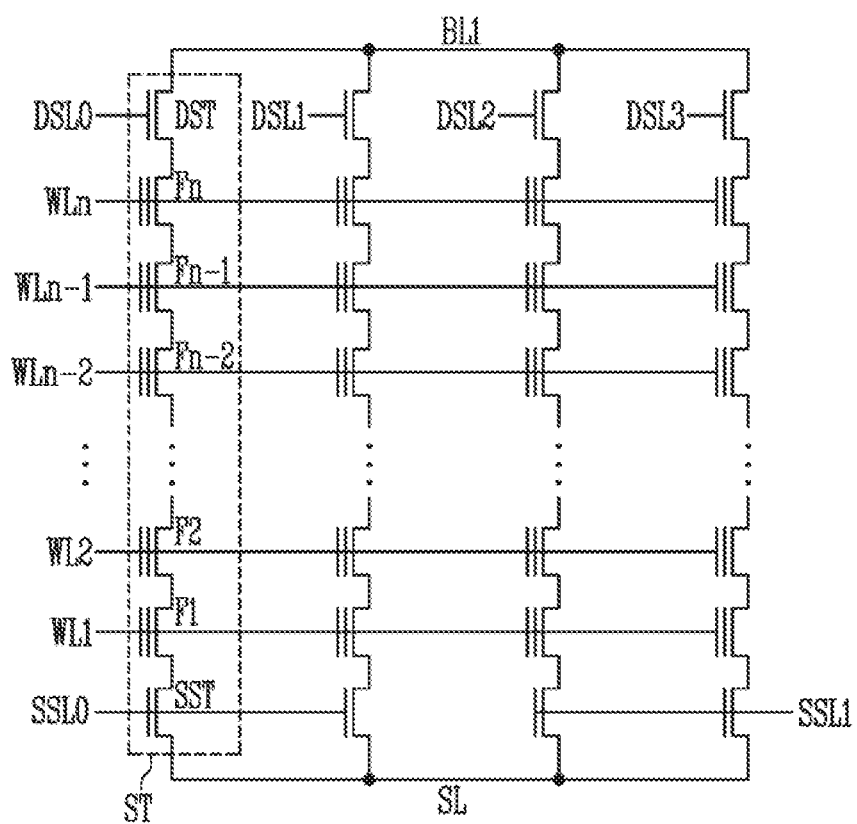
FIG. 4 is a circuit diagram illustrating strings shown in FIG. 3.

FIG. 4 is a circuit diagram illustrating strings shown in FIG. 3.

Referring to FIGS. 3 and 4, each string ST may be coupled between the bit line BL1 to BLm and a source line SL. The string ST coupled between the first bit line BL1 and the source line SL will be described below by way of example.

The string ST may include a source select transistor SST, memory cells F1 to Fn (n is a positive integer), and a drain select transistor DST, which are coupled in series to each other between the source line SL and the first bit line BL1. Gates of the source select transistors SST included in different strings ST coupled to the respective bit lines BL1 to BLm may be coupled to a first source select line SSL0 or a second source select line SSL1. For example, source select transistors disposed adjacent to each other in the second direction Y among the source select transistors SST may be coupled to the same source select line. For example, when it is assumed that the source select transistors SST are successively arranged in the second direction Y, the gates of the source select transistors SST that are arranged in the first direction X from the first source select transistor SST and included in different strings ST and the gates of the source select transistors SST that are arranged in the first direction X from the second source select transistor SST and included in different strings ST may be coupled to the first source select line SSL0. Furthermore, the gates of the source select transistors SST that are arranged in the first direction X from the third source select transistor SST and included in different strings ST and the gates of the source select transistors SST that are arranged in the first direction X from the fourth source select transistor SST and included in different strings ST may be coupled to the second source select line SSL1.

Gates of the memory cells F1 to Fn may be coupled to the word lines WL1 to WLn, and gates of the drain select transistors DST may be coupled to any one of the first to fourth drain select lines DSL0 to DSL3.

Although the gates of the transistors that are arranged in the first direction X among the drain select transistors DST are coupled in common to the same drain select line (e.g., DSL0), the transistors that are arranged in the second direction Y may be coupled to different drain select lines DSL1 to DSL3. For example, if it is assumed that the drain select transistors DST are successively arranged in the second direction Y, the gates of the drain select transistors DST that are arranged in the first direction X from the first drain select transistor DST and included in different strings ST may be coupled to the first drain select line DSL0. The drain select transistors DST that are arranged in the second direction Y from the drain select transistors DST coupled to the first drain select line DSL0 may be successively coupled to the second to fourth drain select lines DSL1 to DSL3. Therefore, in a selected memory block, strings ST coupled to a selected drain select line may be selected, and strings ST coupled to the other unselected drain select lines may be unselected.

Memory cells coupled to the same word lines may form one page PG. Here, the term "page" means a physical page. For example, a group of memory cells coupled in the first direction X in the same word line among the strings ST coupled to the first to m-th bit line BL1 to BLm may be referred to as "page PG". For example, the memory cells that are arranged in the first direction X among the first memory cells F1 coupled to the first word line WL1 may form one page PG. Cells arranged in the second direction Y among the first memory cells F1 coupled in common to the first word line WL1 may be separated into different pages. Therefore, in the case where the first drain select line DSL0 is a selected drain select line and the first word line WL1 is a selected word line, the page that is coupled to the first drain select line DSL0 among the plurality of pages PG coupled to the first word line WL1 may become a selected page. The pages that are coupled in common to the first word line WL1 and coupled to the unselected second to fourth drain select lines DSL1 to DSL3 may become unselected pages.

Although in the drawing there is illustrated the case where one source select transistor SST and one drain select transistor DST are included in each string ST, a plurality of source select transistors SST and a plurality of drain select transistors DST may be included in each string ST depending on the configuration of the memory device. Furthermore, depending on the configuration of the memory device, dummy cells may be provided between the source select transistor SST, the memory cells F1 to Fn, and the drain select transistor DST. Unlike the normal memory cells F1 to Fn, the dummy cells might not store user data but may be used to improve electrical characteristics of each string ST. However, in the present embodiment, the dummy cells are not significant components; therefore, detailed description thereof will be omitted.

Figure 5:
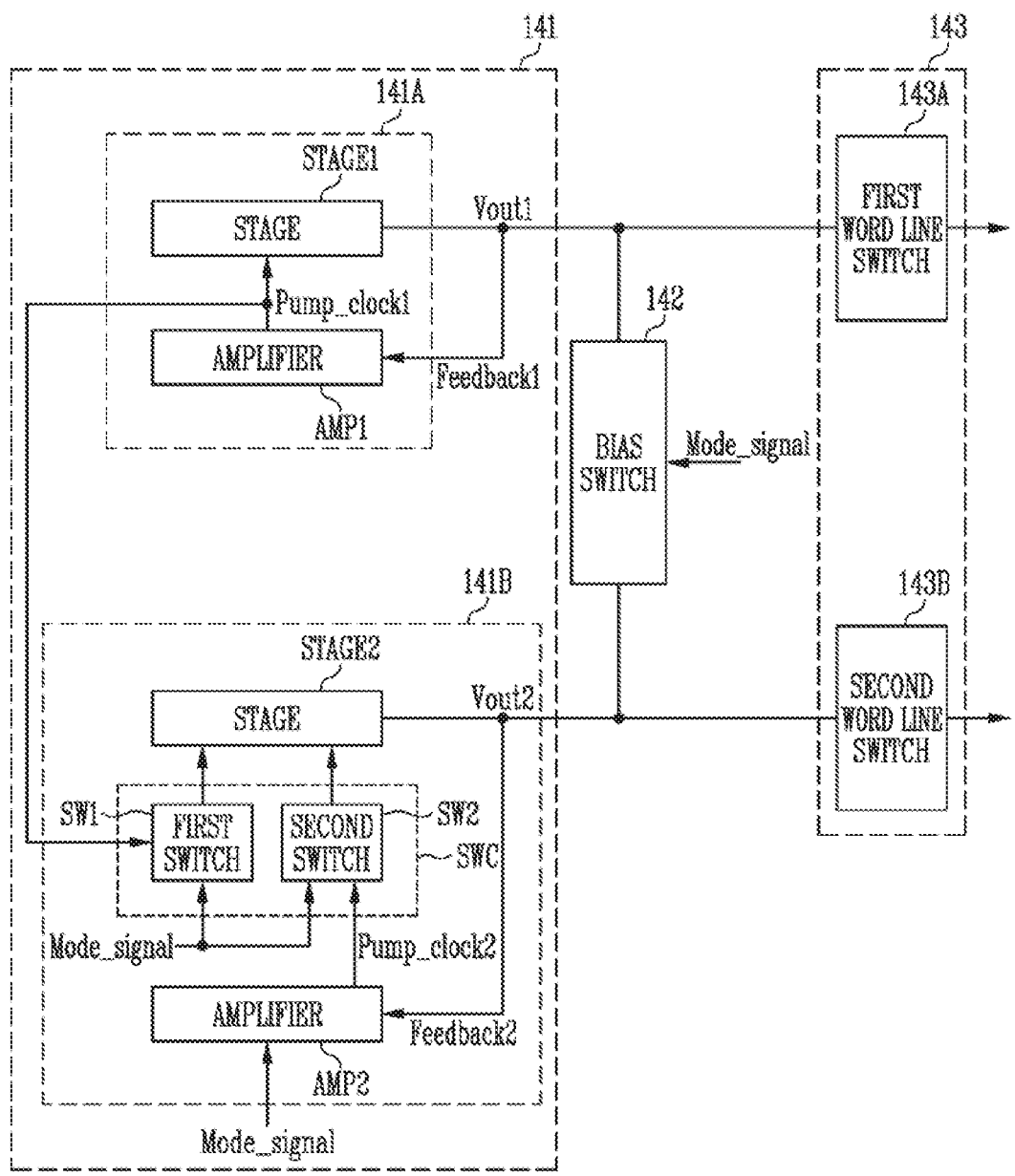
FIG. 5 is a diagram illustrating a voltage generation circuit of FIG. 1.

FIG. 5 is a diagram illustrating the voltage generation circuit 140 of FIG. 1.

Referring to FIG. 5, the voltage generation circuit 140 may include a pump circuit 141, a bias switch 142, and a word line switch circuit 143.

The pump circuit 141 may include a master pump component 141A and least one sub-pump component 141B. The master pump component 141A and the at least one sub-pump component 141B may respectively correspond to the plurality of planes included in the memory cell array 110 of FIG. 1. For example, the master pump component 141A may correspond to the plane Plane0. The sub-pump component 141B may correspond to the plane Plane1.

In the case where the memory device is operated in the interleaved manner, the master pump unit 141A may generate a first output voltage Vout1 to be applied to the corresponding plane Plane0. In the case where the memory device is operated in the non-interleaved manner, the master pump unit 141A may generate a first output voltage Vout1 to be applied to a selected plane of the plurality of planes.

The master pump component 141A may include a stage STAGE1 and an amplifier AMP1.

The stage STAGE1 may generate the first output voltage Vout1 in response to a first pump clock Pump_clock1. For example, the stage STAGE1 may generate the first output voltage Vout1 by performing a pumping operation in response to the first pump clock Pump_clock1.

The amplifier AMP1 may receive the first output voltage Vout1 as a first feedback voltage Feedback1 and generate the first pump clock Pump_clock1 based on a potential level of the first feedback voltage Feedback1.

In the case where the memory device is operated in the interleaved manner, the sub-pump component 141B may generate a second output voltage Vout2 to be applied to the corresponding plane Plane1. In the case where the memory device is operated in the non-interleaved manner, the sub-pump component 141B may disable the operation of an amplifier AMP2 included in the sub-pump component 141B. In an embodiment, when the memory device is operated in the non-interleaved manner, the sub-pump component 141B may disable the operation of an amplifier AMP2 included in the sub-pump component 141B to reduce current consumption.

The sub-pump component 141B may include a stage STAGE2, the amplifier AMP2, and a switch circuit SWC. The stage STAGE2 may generate the second output voltage Vout2 in response to the first pump clock Pump_clock1 or a second pump clock Pump_clock2. For example, the stage STAGE2 may generate the second output voltage Vout2 by performing a pumping operation in response to the first pump clock Pump_clock1 or the second pump clock Pump_clock2. In the case where the memory device is operated in the interleaved manner, the stage STAGE2 may perform a pumping operation in response to the second pump clock Pump_clock2 and thus generate the second output voltage Vout2. In the case where the memory device is operated in the non-interleaved manner, the stage STAGE2 may perform a pumping operation in response to the first pump clock Pump_clock1 and thus generate the second output voltage Vout2 having the same potential level as that of the first output voltage Vout1 so that the pump driving force can be maintained.

The amplifier AMP2 may receive the second output voltage Vout2 as a second feedback voltage Feedback2 and generate the second pump clock Pump_clock2 based on a potential level of the second feedback voltage Feedback2. In the case where the memory device is operated in the interleaved manner, the amplifier AMP2 may be activated to generate the second pump clock Pump_clock2. In the case where the memory device is operated in the non-interleaved manner, the amplifier AMP2 may be disabled to reduce current consumption.

The switch circuit SWC may provide the first pump clock Pump_clock1 or the second pump clock Pump_clock2 to the stage STAGE2 in response to a mode signal Mode_signal. For example, if the mode signal Mode_signal indicates the interleaved manner, the switch circuit SWC may provide the second pump clock Pump_clock2 to the stage STAGE2. If the mode signal Mode_signal indicates the non-interleaved manner, the switch circuit SWC may provide the first pump clock Pump_clock1 to the stage STAGE2. The switch circuit SWC may include a first switch SW1 and a second switch SW2. In response to the mode signal Mode_signal, the first switch SW1 may supply the first pump clock Pump_clock1 to the stage STAGE2 or interrupt (block) the supply of Pump clock1. For example, the first switch SW1 may be switched such that, if the mode signal Mode_signal indicates the interleaved manner, the supply of the first pump clock Pump_clock1 to the stage STAGE2 is interrupted, and if the mode signal Mode_signal indicates the non-interleaved manner, the first pump clock Pump_clock1 is supplied to the stage STAGE2. In response to the mode signal Mode_signal, the second switch SW2 may supply the second pump clock Pump_clock2 to the stage STAGE2 or interrupt the supply. For example, the second switch SW2 may be switched such that, if the mode signal Mode_signal indicates the interleaved manner, the second pump clock Pump_clock2 is supplied to the stage STAGE2, and if the mode signal Mode_signal indicates the non-interleaved manner, the supply of the second pump clock Pump_clock2 to the stage STAGE2 is interrupted.

The bias switch 142 may be coupled between an output terminal of the master pump component 141A and an output terminal of the sub-pump component 141B. The bias switch 142 may be activated in response to the mode signal Mode_signal to electrically connect the output terminal of the master pump component 141A with the output terminal of the sub-pump component 141B or block the electrical connection therebetween. For example, if the memory device is operated in the interleaved manner, the bias switch 142 may be disabled in response to the mode signal Mode_signal and thus electrically disconnect the output terminal of the master pump component 141A from the output terminal of the sub-pump component 141B. Hence, the first output voltage Vout1 generated from the master pump component 141A may be transmitted to the first word line switch 143A corresponding to the plane Plane0. The second output voltage Vout2 generated from the sub-pump component 141B may be transmitted to the second word line switch 143B corresponding to the plane Plane1. If the memory device is operated in the non-interleaved manner; the bias switch 142 may be activated in response to the mode signal Mode_signal and thus electrically connect the output terminal of the master pump component 141A with the output terminal of the sub-pump component 141B. Hence, the first output voltage Vout1 generated from the master pump component 141A may be transmitted to the first word line switch 143A corresponding to the plane Plane0 and the second word line switch 143B corresponding to the plane Plane1.

The word line switch circuit 143 may receive the first output voltage Vout1 generated from the master pump component 141A and the second output voltage Vout2 generated from the sub-pump component 141B and transmit the first and second output voltages Vout1 and Vout2 respectively to the first and second decoders 121 and 122 included in the word line decoder circuit 120 of FIG. 1. Alternatively, the word line switch circuit 143 may receive the first output voltage Vout1 generated from the master pump component 141A and selectively transmit the first output voltage Vout1 to a selected plane of the plurality of planes Plane0 and Plane1.

The word line switch circuit 143 may include a first word line switch 143A and a second word line switch 143B that respectively correspond to the plurality of planes Plane0 and Plane1. The first word line switch 143A and the second word line switch 143B may respectively correspond to the first decoder 121 and the second decoder 122 that are included in the word line decoder circuit 120 of FIG. 1.

In the case where the memory device is operated in the interleaved manner, the first word line switch 143A may transmit the first output voltage Vout1 generated from the master pump component 141A to the first decoder 121, and the second word line switch 143B may transmit the second output voltage Vout2 generated from the sub-pump component 141B to the second decoder 122. In the case where the memory device is operated in the non-interleaved manner, the word line switch that corresponds to the selected plane of the first and second word line switches 143A and 143B may be activated. The activated word line switch 143A or 143B may receive the first output voltage Vout1 generated from the master pump component 141A and transmit the first output voltage Vout1 to the corresponding decoder 121 or 122.

Figure 6:
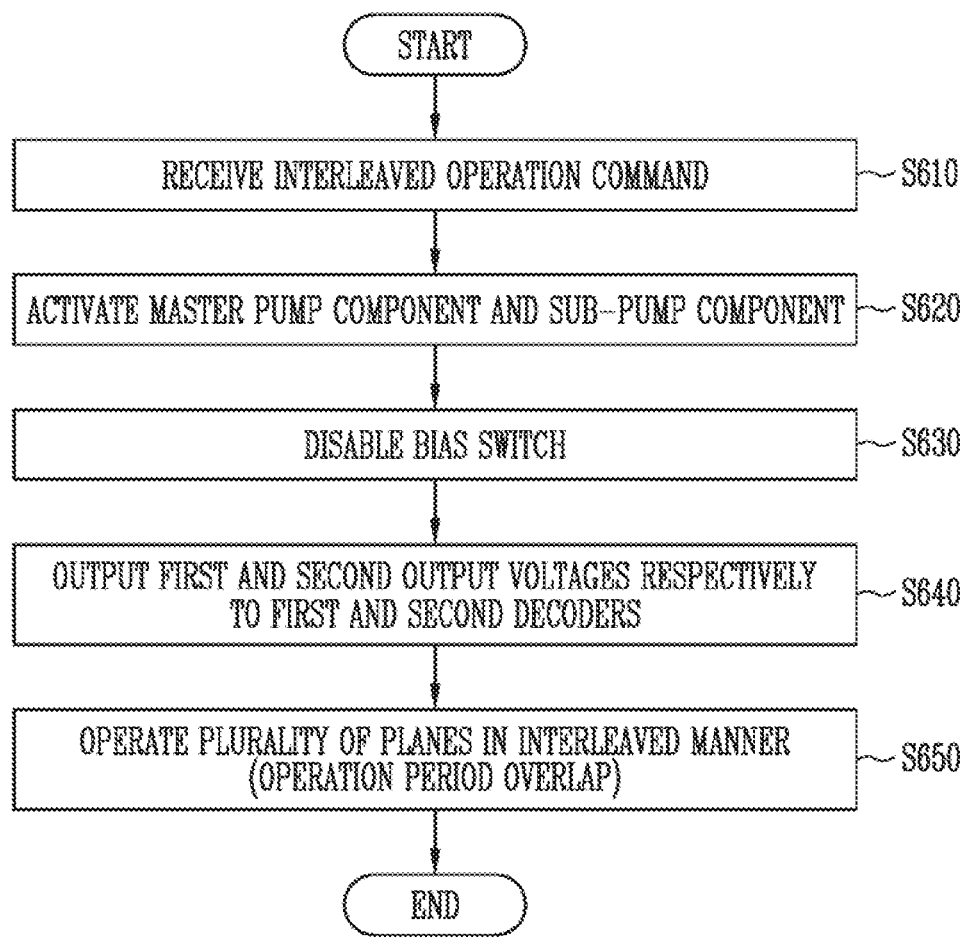
FIG. 6 is a flowchart of a method of operating a memory device in an interleaved manner in accordance with an embodiment of the present disclosure.

FIG. 6 is a flowchart of a method of operating the memory device in the interleaved manner in accordance with an embodiment of the present disclosure.

The method of operating the memory device in the interleaved manner will be described with reference to FIGS. 1 to 6.

The memory device 100 may receive a command CMD corresponding to a program operation, a read operation, or an erase operation from an external device (at step S610). The received command CMD may be an interleaved operation command for controlling the memory device 100 such that the plurality of planes Plane0 and Plane1 included in the memory device 100 are operated in the interleaved manner.

The master pump component 141A and the at least one sub-pump component 141B that are included in the pump circuit 141 of the voltage generation circuit 140 may be activated (at step S620). For example, the amplifier AMP1 of the master pump component 141A may generate and output a first pump clock Pump_clock1 having a predetermined cycle. The stage STAGE1 may generate a first output voltage Vout1 in response to the first pump clock Pump_clock1. The amplifier AMP1 may receive the first output voltage Vout1 as a first feedback voltage Feedback1 and generate the first pump clock Pump_clock1 based on a potential level of the first feedback voltage Feedback1. For example, if the potential level of the first feedback voltage Feedback1 is higher than a reference voltage level, the amplifier AMP1 may suspend the operation of generating the first pump clock Pump_clock1. Hence, the pumping operation of the stage STAGE1 may be stopped so that the first output voltage Vout1 is reduced. If the potential level of the first feedback voltage Feedback1 is lower than the reference voltage level, the amplifier AMP1 may continuously generate the first pump clock Pump_clock1. Hence, the pumping operation of the stage STAGE1 may be continuously performed so that the first output voltage Vout1 is increased. According to the foregoing operation, the master pump component 141A may generate and output the first output voltage Vout1 having a constant potential level.

The amplifier AMP2 of the at least one sub-pump component 141B may generate and output a second pump clock Pump_clock2 having a predetermine cycle. The second switch SW2 that is activated in response to a mode signal Mode_signal indicating an interleaved operation may transmit the second pump clock Pump_clock2 to the stage STAGE2. The first switch SW1 may be disabled in response to the mode-signal Mode_signal so that the first pump clock Pump_clock1 generated from the-master pump component 141A is blocked from being transmitted to the stage-STAGE2. The stage STAGE2 may generate the second output voltage Vout2, different in level from Vout1, in response to a second pump clock Pump_clock2. The amplifier AMP2 may receive the second output voltage Vout2 as a second feedback voltage Feedback2 and generate the second pump clock Pump_clock2 based on a potential level of the second feedback voltage Feedback2. For example, if the potential level of the second feedback voltage Feedback2 is higher than a reference voltage level, the amplifier AMP2 may suspend the operation of generating the second pump clock Pump_clock2. Hence, the pumping operation of the stage STAGE2 may be stopped so that the second output voltage Vout2 is reduced. If the potential level of the second feedback voltage Feedback2 is lower than the reference voltage level, the amplifier AMP2 may continuously generate the second pump clock Pump_clock2. Hence, the pumping operation of the stage STAGE2 may be continuously performed so that the second output voltage Vout2 is increased. According to the foregoing operation, the sub-pump component 141B may generate and output the second output voltage Vout2 having a constant potential level.

The bias switch 142 of the voltage generation circuit 140 may be disabled in response to the mode signal Mode_signal during the interleaved operation (at step S630). In other word, the bias switch 142 may electrically disconnect the output terminal of the master pump circuit 141A from the output terminal of the sub-pump circuit 141B. Hence, the first output voltage Vout1 generated from the master pump circuit 141A may be transmitted to the first word line switch 143A corresponding to the plane Plane0. The second output voltage Vout2 generated from the sub-pump circuit 141B may be transmitted to the second word line switch 143B corresponding to the plane Plane1.

The word line switch circuit 143 of the voltage generation circuit 140 may transmit the first output voltage Vout1 to the first decoder 121 of the word line decoder circuit 120, and transmit the second output voltage Vout2 to the second decoder 122 of the word line decoder circuit 120 (at step S640). For example, the first word line switch 143A of the word line switch circuit 143 may receive the first output voltage Vout1 from the master pump component 141A and transmit the first output voltage Vout1 to the first decoder 121. The second word line switch 143B may receive the second output voltage Vout2 from the sub-pump circuit 141B and transmit the second output voltage Vout2 to the second decoder 122.

The word line decoder circuit 120 and the read/write circuit 130 may perform overall operations on the plurality of planes Plane0 and Plane1 included in the memory cell array 110 in the interleaved manner (at step S650). For example, the word line decoder circuit 120 may transmit the first and second output voltages Vout1 and Vout2 received from the voltage generation circuit 140 to the plurality of planes Plane0 and Plane1, respectively. The read/write circuit 130 may adjust the potential levels of the bit lines BL1 to BLm depending on data DATA received during a program operation on each of the plurality of planes Plane0 and Plane1, or sense the potential levels of the bit liens BL1 to BLm during a read operation. The overall operation periods of the plurality of planes Plane0 and Plane1 may overlap with each other. In other words, while the overall operation of the plane Plane0 is performed, the overall operation of the plane Plane1 may be performed.

Figure 7:
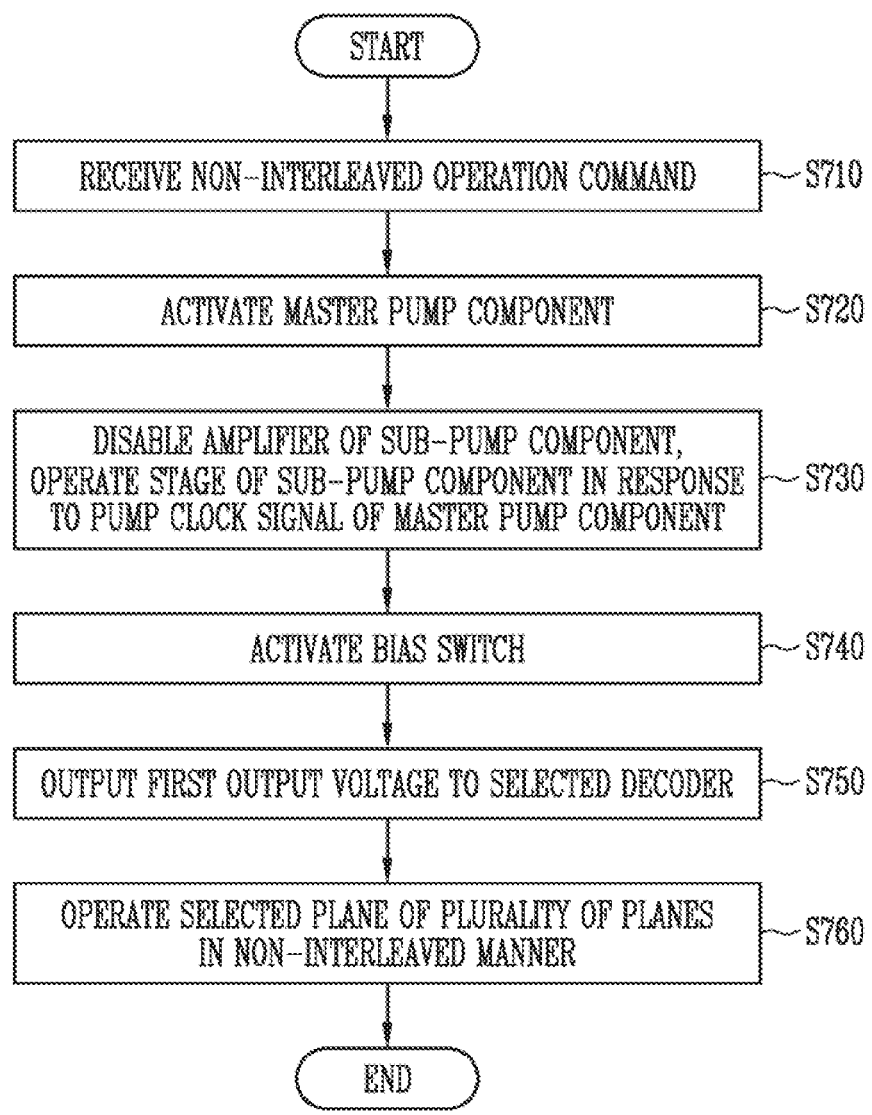
FIG. 7 is a flowchart of a method of operating a memory device in a non-interleaved manner in accordance with an embodiment of the present disclosure.

FIG. 7 is a flowchart of a method of operating the memory device in the non-interleaved manner in accordance with an embodiment of the present disclosure.

The method of operating the memory device in the non-interleaved manner will be described with reference to FIGS. 1 to 5 and 7.

The memory device 100 may receive a command CMD corresponding to a program operation, a read operation, or an erase operation from an external device (at step S710). The received command CMD may be a non-interleaved operation command for controlling the memory device 100 such that the plurality of planes Plane0 and Plane1 included in the memory device 100 are operated in the non-interleaved manner.

The master pump component 141A included in the pump circuit 141 of the voltage generation circuit 140 may be activated (at step S720). For example, the amplifier AMP1 of the master pump component 141A may generate and output a first pump clock Pump_clock1 having a predetermined cycle. The stage STAGE1 may generate a first output voltage Vout1 in response to the first pump clock Pump_clock1. The amplifier AMP1 may receive the first output voltage Vout1 as a first feedback voltage Feedback1 and generate the first pump clock Pump_clock1 based on a potential level of the first feedback voltage Feedback1. For example, if the potential level of the first feedback voltage Feedback1 is higher than a reference voltage level, the amplifier AMP1 may suspend the operation of generating the first pump clock Pump_clock1. Hence, the pumping operation of the stage STAGE1 may be stopped so that the first output voltage Vout1 is reduced. If the potential level of the first feedback voltage Feedback1 is lower than a reference voltage level, the amplifier AMP1 may continuously generate the first pump clock Pump_clock1. Hence, the pumping operation of the stage STAGE1 may be continuously performed so that the first output voltage Vout1 is increased. According to the foregoing operation, the master pump component 141A may generate and output the first output voltage Vout1 having a constant potential level.

The amplifier AMP2 of the at least one sub-pump component 141B may be disabled in response to a mode signal Mode_signal indicating the non-interleaved operation. The stage STAGE2 of the at least one sub-pump component 141B may be operated in response to the first pump clock Pump_clock1 (at step S730). For example, the first switch SW1 of the sub-pump component 141B may be enabled in response to the mode signal Mode_signal indicating the non-interleaved operation and provide a first pump clock Pump_clock1 generated from the master pump component 141A to the stage STAGE2. The second switch SW2 may be disabled in response to the mode signal Mode_signal indicating the non-interleaved operation. Hence, the stage STAGE2 of the sub-pump component 141B may generate a second output voltage Vout2 having the same potential level as that of the first output voltage Vout1 in response to the first pump clock Pump_clock1. Since the amplifier AMP2 of the at least one sub-pump component 141B is disabled, the current consumption may be reduced.

The bias switch of the voltage generation circuit 140 may be activated in response to the mode signal Mode_signal during the non-interleaved operation (at step S740). In other word, the bias switch 142 may electrically connect the output terminal of the master pump component 141A with the output terminal of the sub-pump component 141B. Hence, the first output voltage Vout1 generated from the master pump component 141A may be transmitted to the first word line switch 143A corresponding to the plane Plane0 and the second word line switch 143B corresponding to the plane Plane1. Here, since the stage STAGE2 of the sub-pump component 141B is operated in response to the first pump clock Pump_clock1, the driving force of the pump circuit 141 may be maintained.

The word line switch circuit 143 of the voltage generation circuit 140 may selectively transmit the first output voltage Vout1 to either the first decoder 121 or the second decoder 122 that corresponds to a selected plane of the plurality of planes Plane0 and Plane1 (at step S750).

The word line decoder circuit 120 and the read/write circuit 130 may perform an overall operation for the selected plane of the plurality of planes Plane0 and Plane1 included in the memory cell array 110 in the non-interleaved manner (at step S760). For example, the word line decoder circuit 120 may transmit the first output voltage Vout1 received from the voltage generation circuit 140 to the selected plane of the plurality of planes Plane0 and Plane1. The read/write circuit 130 corresponding to the selected plane of the plurality of planes Plane0 and Plane1 may adjust the potential levels of the bit lines BL1 to BLm depending on data DATA received during a program operation, or sense the potential levels of the bit liens BL1 to BLm during a read operation so that the overall operation on the selected plane may be performed.

If the overall operation on the selected plane is completed, another plane may be selected, and steps S720 to S760 described above may be re-performed. In other words, the plurality of planes Plane0 and Plane1 may be sequentially selected, and an overall operation may be performed thereon.

Figure 8:
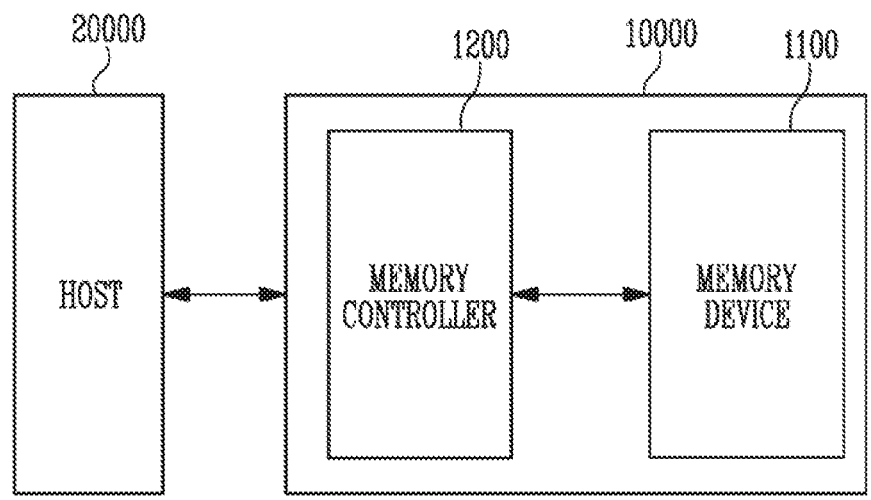
FIG. 8 is a diagram illustrating a memory system including the memory device of FIG. 1.

FIG. 8 is a diagram illustrating a memory system 10000 including the memory device of FIG. 1.

Referring to FIG. 8, the memory system 10000 may include a memory device 1100 configured to store data, and a memory controller 1200 configured to control the memory device 1100 under control of a host 2000.

The host 20000 may use, to communicate with the memory system 10000, an interface protocol such as a PCI-E (peripheral component interconnect-express), an ATA (advanced technology attachment), an SATA (serial ATA), a PATA (parallel ATA) or an SAS (serial attached SCSI). In addition, the interface protocol provided for the purpose of data communication between the host 20000 and the memory system 10000 is not limited to the foregoing examples, and it may be any one of interface protocols such as a universal serial bus (USB) protocol, a multi-media card (MMC) protocol, an enhanced small disk interface (ESDI) protocol, and an integrated drive electronics (IDE) protocol.

The memory controller 1200 may control the overall operation of the memory system 10000 and data exchange between the host 20000 and the memory device 1100. For instance, the memory controller 1200 may control the memory device 1100 to program or read data in response to a request of the host 20000. Furthermore, the memory controller 1200 may control the memory device 1100 such that information is stored in main memory blocks and sub-memory blocks included in the memory device 1100, and a program operation is performed on the main memory blocks or the sub-memory blocks depending on the amount of data loaded for the program operation. In an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), or a flash memory. The configuration and the operation of the memory device 1100 may be the same as those of the memory device 100 of FIG. 1. The memory device 1100 may perform a program operation, a read operation, or an erase operation under control of the memory controller 1200.

Figure 9:
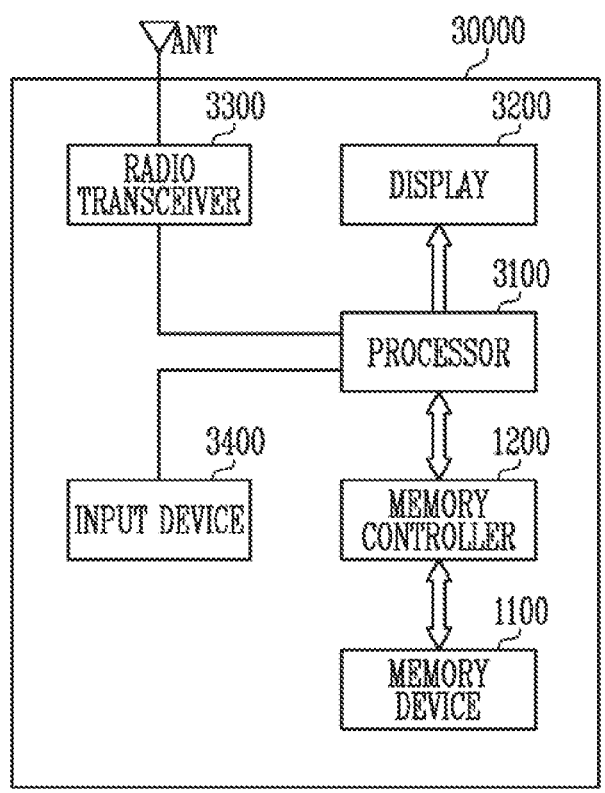
FIG. 9 is a diagram illustrating a memory system in accordance with an embodiment of the present disclosure.

FIG. 9 is a diagram illustrating a memory system 30000 in accordance with an embodiment of the present disclosure.

Referring to FIG. 9, the memory system 30000 may be embodied in a cellular phone, a smartphone, a tablet PC, a personal digital assistant (PDA) or a wireless communication device. The memory system 30000 may include a memory device 1100, and a memory controller 1200 configured to control the operation of the memory device 1100. Under control of the process 3100, the memory system 30000 of the memory device 1100 may be embodied in a cellular phone, a smartphone, a tablet PC, a personal digital assistant (PDA) or a wireless communication device. The memory system 30000 may include a memory device 1100, and a memory controller 1200 configured to control the operation of the memory device 1100. The memory controller 1200 may control a data access operation, e.g., a program operation, an erase operation, or a read operation, of the memory device 1100 under control of a processor 3100.

Data programmed in the memory device 1100 may be outputted through a display 3200 under control of the memory controller 1200. The configuration and the operation of the memory device 1100 may be the same as those of the memory device 100 of FIG. 1.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the memory controller 1200, data outputted from the radio transceiver 3300, or data outputted form the input device 3400 is outputted through the display 3200.

In an embodiment, the memory controller 1200 capable of controlling the operation of the memory device 1100 may be embodied as a part of the processor 3100 or a chip provided separately from the processor 3100.

Figure 10:
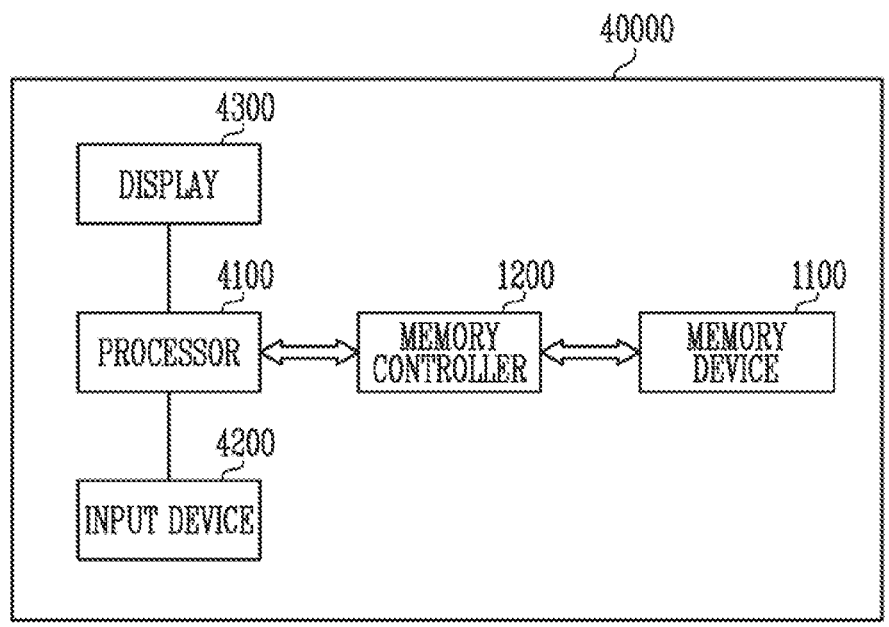
FIG. 10 is a diagram illustrating a memory system in accordance with an embodiment of the present disclosure.

FIG. 10 is a diagram illustrating a memory system 40000 in accordance with an embodiment of the present disclosure.

Referring to FIG. 10, the memory system 40000 may be embodied in a personal computer (PC), a tablet PC, a net-book, an reader, a personal digital assistant (PDA), a portable multimedia player (PMP), an MP3 player, or an MP4 player.

The memory system 40000 may include the memory device 1100, and a memory controller 1200 configured to control the data processing operation of the memory device 1100. The configuration and the operation of the memory device 1100 may be the same as those of the memory device 100 of FIG. 1.

A processor 4100 may output data stored in the memory device 1100 through a display 4300, according to data inputted from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 1200. In an embodiment, the memory controller 1200 capable of controlling the operation of the memory device 1100 may be embodied as a part of the processor 4100 or a chip provided separately from the processor 4100.

Figure 11:
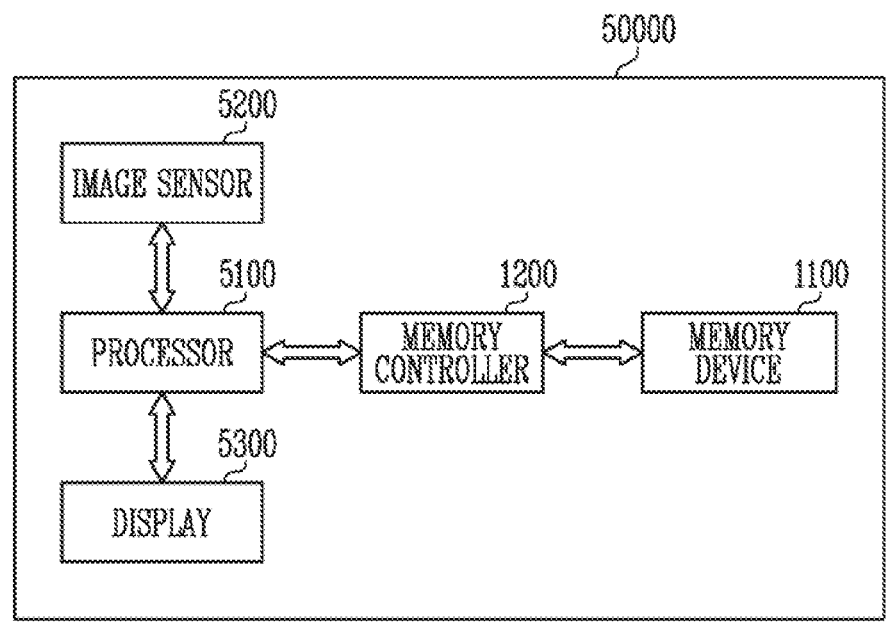
FIG. 11 is a diagram illustrating a memory system in accordance with an embodiment of the present disclosure.

FIG. 11 is a diagram illustrating a memory system 50000 in accordance with an embodiment of the present disclosure.

Referring to FIG. 11, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 1100, and a memory controller 1200 capable of controlling a data processing operation, e.g., a program operation, an erase operation, or a read operation, of the memory device 1100. The configuration and the operation of the memory device 1100 may be the same as those of the memory device 100 of FIG. 1.

An image sensor 5200 of the memory system 50000 may convert an optical image into digital signals. The converted digital signals may be transmitted to a processor 5100 or the memory controller 1200. Under control of the processor 5100, the converted digital signals may be outputted through a display 5300 or stored in the memory device 1100 through the memory controller 1200. Data stored in the memory device 1100 may be outputted through the display 5300 under control of the processor 5100 or the memory controller 1200.

In an embodiment, the memory controller 1200 capable of controlling the operation of the memory device 1100 may be embodied as a part of the processor 5100 or a chip provided separately from the processor 5100.

Figure 12:
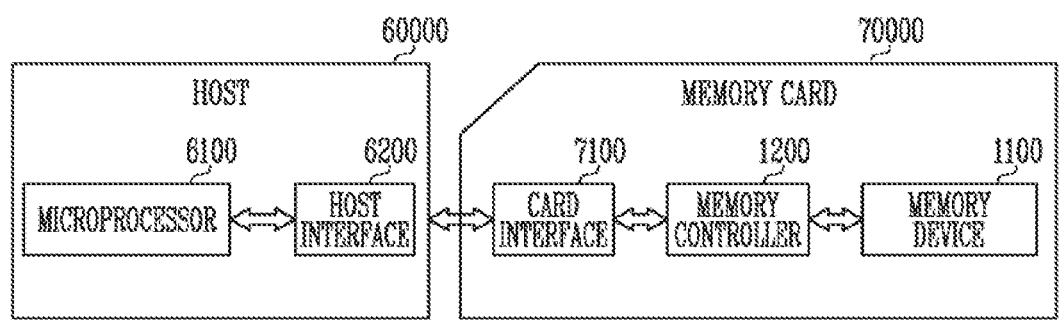
FIG. 12 is a diagram illustrating a memory system in accordance with an embodiment of the present disclosure.

FIG. 12 is a diagram illustrating a memory system 70000 in accordance with an embodiment of the present disclosure.

Referring to FIG. 12, the memory system 70000 may be embodied in a memory card or a smart card. The memory system 70000 may include a memory device 1100, a memory controller 1200, and a card interface 7100. The configuration and the operation of the memory device 1100 may be the same as those of the memory device 100 of FIG. 1.

The controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under control of a microprocessor 6100.

In the above-discussed embodiments, all steps may be selectively performed or skipped. In addition, the steps in each embodiment might not be always performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

In various embodiments of the present disclosure, a plurality of planes may be operated in an interleaved manner or a non-interleaved manner. When the plurality of planes are operated in the non-interleaved manner, current consumption may be reduced.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
a memory cell array comprising a plurality of planes; and
a voltage generation circuit comprising a master pump component corresponding to a first plane of the plurality of planes and at least one or more sub-pump components that respectively correspond to other planes, other than the first plane, of the plurality of planes,
wherein, during an interleaved operation, the master pump component generates a first output voltage in response to a first pump clock, each of the at least one or more sub-pump components generate a second output voltage, different from the first output voltage, in response to a respective second pump clock, and the master pump component provides the first output voltage to the first plane, and each of the at least one or more sub-pump components respectively provides the second output voltage to its respective corresponding plane of the other planes, and wherein, during a non-interleaved operation, each of the master pump component and the at least one or more sub-pump components generates the first output voltage in response to the first pump clock, and the voltage generation circuit provides the first output voltage to a selected plane of the plurality of planes.

2. The memory device according to claim 1, further comprising a word line decoder circuit coupled between the voltage generation circuit and the memory cell array,
wherein the word line decoder circuit comprises a plurality of decoders respectively corresponding to the plurality of planes.

3. The memory device according to claim 2, wherein the voltage generation circuit comprises:
a pump circuit comprising the master pump component and the at least one or more sub-pump components;
a bias switch configured to electrically connect an output terminal of the master pump component with output terminals of the at least one or more sub-pump components during the non-interleaved operation; and
a word line switch circuit configured to receive the first output voltage and the second output voltages from the master pump component and each of the at least one or more sub-pump components and transmit the first output voltage and the second output voltages to the word line decoder circuit.

4. The memory device according to claim 3, wherein the bias switch electrically disconnects the output terminal of the master pump component from the output terminals of the at least one or more sub-pump components during the interleaved operation.

5. The memory device according to claim 3,
wherein the word line switch circuit comprises a plurality of word line switches respectively corresponding to the plurality of planes, and
wherein, during the interleaved operation, each of the plurality of word line switches receives one of the first output voltage and the second output voltages that are generated from the master pump component and each of the at least one or more sub-pump components, and transmits the received output voltage to a corresponding decoder of the plurality of decoders.

6. The memory device according to claim 3, wherein the master pump component comprises:
a first stage configured to generate the first output voltage in response to the first pump clock; and
a first amplifier configured to receive the first output voltage as a first feedback voltage and generate the first pump clock in response to the received first feedback voltage.

7. The memory device according to claim 6, wherein each of the at least one or more sub-pump components comprises:
a second stage configured to generate the second output voltages in response to the respective second pump clocks during the interleaved operation;
a second amplifier configured to receive the second output voltage as a second feedback voltage and generate the respective second pump clocks in response to the received second feedback voltage; and
a first switch configured to provide the respective second pump clocks to the second stage during the interleaved operation.

8. The memory device according to claim 7, wherein each of the at least one or more sub-pump components further comprises a second switch configured to provide the first pump clock generated from the master pump component to the second stage during the non-interleaved operation.

9. A memory device comprising:
a memory cell array comprising a plurality of planes; and
a voltage generation circuit comprising a master pump component corresponding to a first plane of the plurality of planes and at least one or more sub-pump components that respectively correspond to other planes, other than the first plane, of the plurality of planes,
wherein the voltage generation circuit provides, during an interleaved operation, a plurality of output voltages that are respectively generated from the master pump component and the at least one or more sub-pump components respectively to the plurality of planes, and provides, during a non-interleaved operation, an output voltage generated from the master pump component to a selected plane of the plurality of planes.

10. The memory device according to claim 9, further comprising a word line decoder circuit coupled between the voltage generation circuit and the memory cell array,
wherein the word line decoder circuit comprises a plurality of decoders respectively corresponding to the plurality of planes.

11. The memory device according to claim 10, wherein the voltage generation circuit comprises:
a pump circuit comprising the master pump component and the at least one or more sub-pump components;
a bias switch configured to electrically connect an output terminal of the master pump component with output terminals of the at least one or more sub-pump components during the non-interleaved operation; and a word line switch circuit configured to receive the plurality of output voltages from the master pump component and the at least one or more sub-pump components and transmit the output voltages to the word line decoder circuit.

12. The memory device according to claim 11, wherein the bias switch electrically disconnects the output terminal of the master pump component from the output terminals of the at least one or more sub-pump components during the interleaved operation.

13. The memory device according to claim 11,
wherein the word line switch circuit comprises a plurality of word line switches respectively corresponding to the plurality of planes, and
wherein, during the interleaved operation, each of the plurality of word line switches receives one of the plurality of output voltages that are generated from the master pump component and the at least one or more sub-pump components, and transmits the received output voltage to a corresponding decoder of the plurality of decoders.

14. The memory device according to claim 11, wherein the master pump component comprises:
a first stage configured to generate a first output voltage of the plurality of output voltages in response to the first pump clock; and
a first amplifier configured to receive the first output voltage as a first feedback voltage and generate the first pump clock in response to the received first feedback voltage.

15. The memory device according to claim 14, wherein each of the at least one or more sub-pump components comprises:
a second stage configured to generate a second output voltage of the plurality of output voltages in response to the second pump clock during the interleaved operation; and
a second amplifier configured to receive the second output voltage as a second feedback voltage and generate the second pump clock in response to the received second feedback voltage; and
a first switch configured to provide the second pump clock to the second stage during the interleaved operation.

16. The memory device according to claim 15, wherein each of the at least one or more sub-pump components further comprises a second switch configured to provide the first pump clock generated from the master pump component to the second stage during the non-interleaved operation.

17. The memory device according to claim 16, wherein the second stage is operated in response to the first pump clock during the non-interleaved operation and generates the second output voltage having a level equal to a level of the first output voltage.

18. The memory device according to claim 16, wherein the second amplifier is disabled during the non-interleaved operation.

19. A memory device comprising:
a memory cell array comprising a first plane and a second plane; and
a voltage generation circuit comprising a master pump component corresponding to the first plane and a sub-pump component corresponding to the second plane, and configured to provide, during an interleaved operation, a first output voltage generated from the master pump component to the first plane and provide a second output voltage generated from the sub-pump component to the second plane, and selectively provide, during a non-interleaved operation, the first output voltage generated from the master pump circuit to one of the first plane and the second plane,
wherein the master pump component comprises:
a first stage configured to generate the first output voltage in response to a first pump clock; and
a first amplifier configured to receive the first output voltage as a first feedback voltage and generate the first pump clock in response to the received first feedback voltage.

20. The memory device according to claim 19, wherein the sub-pump component comprises:
a second stage configured to generate the second output voltage in response to a second pump clock during the interleaved operation;
a second amplifier configured to receive the second output voltage as a second feedback voltage and generate the second pump clock in response to the received second feedback voltage; and
a first switch configured to provide the second pump clock to the second stage during the interleaved operation.

21. The memory device according to claim 20, wherein the sub-pump component further comprises a second switch configured to provide the first pump clock generated from the master pump component to the second stage during the non-interleaved operation.

22. The memory device according to claim 20, wherein the second amplifier is disabled during the non-interleaved operation.

23. The memory device according to claim 19, wherein the voltage generation circuit further comprises a bias switch configured to electrically connect, during the non-interleaved operation, an output terminal of the master pump component with an output terminal of the sub-pump component, and electrically disconnect, during the interleaved operation, the output terminal of the master pump component from the output terminal of the sub-pump component.

24. A method of operating a memory device, the memory device performing an interleaved operation and a non-interleaved operation each in response to respective commands,
wherein the interleaved operation comprises:
generating, a first output voltage and a second output voltage by activating a master pump component and a sub-pump component that respectively correspond to a first plane and a second plane; and
performing overall operations of the first plane and the second plane in an interleaved manner by providing the first output voltage to the first plane and providing the second output voltage to the second plane;
wherein the non-interleaved operation comprises:
generating, the first output voltage by activating the master pump component; and
performing an overall operation of a selected plane of the first plane and the second plane in a non-interleaved manner by providing the first output voltage to the selected plane.

25. The method according to claim 24, further comprising electrically connecting an output terminal of the master pump component with an output terminal of the sub-pump component during the non-interleaved operation.

26. The method according to claim 25, wherein, during the non-interleaved operation, an amplifier included in the sub-pump component is disabled, and the sub-pump component generates the second output voltage having a level equal to a level of the first output voltage in response to a pumping clock generated from the master pump component.

\* \* \* \* \*